United States Patent
Sanders et al.

(10) Patent No.: US 10,175,047 B2
(45) Date of Patent: Jan. 8, 2019

(54) SYSTEMS AND METHODS FOR DYNAMIC BIAS OFFSET OPERATION IN RESONATOR FIBER OPTIC GYROSCOPE

(71) Applicant: Honeywell International Inc., Morris Plains, NJ (US)

(72) Inventors: Glen A. Sanders, Scottsdale, AZ (US); Lee K. Strandjord, Tonka Bay, MN (US); Austin Taranta, Scottsdale, AZ (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/591,950

(22) Filed: May 10, 2017

(65) Prior Publication Data
US 2018/0328732 A1    Nov. 15, 2018

(51) Int. Cl.
*G01C 19/72*   (2006.01)
*H01S 5/0687*  (2006.01)
(Continued)

(52) U.S. Cl.
CPC .......... *G01C 19/727* (2013.01); *H01S 5/0687* (2013.01); *H01S 5/1071* (2013.01); *H01S 5/40* (2013.01)

(58) Field of Classification Search
CPC .......... G01C 19/72; G01C 19/64; G01C 19/66
See application file for complete search history.

(56) References Cited

U.S. PATENT DOCUMENTS 4,825,261 A     4/1989  Schroeder
4,874,244 A  *  10/1989 Kersey ............... G01C 19/721
                                                    356/460
(Continued)

FOREIGN PATENT DOCUMENTS

EP      0507536 A2    10/1992
EP      2293014 A2     3/2011
(Continued)

OTHER PUBLICATIONS

European Patent Office, "Extended European Search Report from EP Application No. 16157963.6 dated Sep. 28, 2016", "from Foreign Counterpart of U.S. Appl. No. 14/708,928", Sep. 28, 2016, pp. 1-9, Published in: EP.

(Continued)

*Primary Examiner* — Jonathan Hansen
(74) *Attorney, Agent, or Firm* — Fogg & Powers LLC (57) ABSTRACT

Systems and methods for dynamic bias offset operation in RFOGs are provided. In certain embodiments, an RFOG system includes a fiber optic resonator; laser sources that launch first and second optical beams into the fiber optic resonator in opposite directions; a first servo loop configured to lock the first optical beam to a resonance frequency, the first servo loop including a modulator that modulates the first optical beam at a first resonant tracking frequency; a second servo loop configured to lock the second optical beam frequency, on average, to a resonance frequency, the second servo loop including a modulator that modulates the second optical beam at a second resonant tracking frequency, wherein the second optical beam is further modulated by a modulation frequency; and a filter configured to attenuate signals that result from the interference of the first and second optical beams.

19 Claims, 6 Drawing Sheets

(51) Int. Cl.
*H01S 5/10* (2006.01)
*H01S 5/40* (2006.01)

(56) References Cited

U.S. PATENT DOCUMENTS

| | | | |
|---|---|---|---|
| 7,362,443 B2 | 4/2008 | Sanders et al. | |
| 7,372,574 B2 | 5/2008 | Sanders et al. | |
| 7,933,020 B1 | 4/2011 | Strandjord et al. | |
| 8,223,341 B2 | 7/2012 | Strandjord et al. | |
| 8,274,659 B2 | 9/2012 | Qiu et al. | |
| 8,873,063 B2 | 10/2014 | Sanders et al. | |
| 9,001,336 B1 | 4/2015 | Qiu et al. | |
| 9,121,708 B1 | 9/2015 | Qiu | |
| 2010/0245834 A1 | 9/2010 | Strandjord | |
| 2011/0292396 A1* | 12/2011 | Strandjord | G01C 19/727 356/461 |
| 2012/0050745 A1 | 3/2012 | Qiu et al. | |
| 2014/0211211 A1* | 7/2014 | Qiu | G01C 19/727 356/461 |
| 2014/0240712 A1* | 8/2014 | Strandjord | G01C 19/727 356/461 |
| 2014/0369699 A1* | 12/2014 | Strandjord | G01C 19/721 398/187 |
| 2015/0098089 A1 | 4/2015 | Schwartz et al. | |
| 2016/0334217 A1 | 11/2016 | Strandjord et al. | |

FOREIGN PATENT DOCUMENTS

| | | |
|---|---|---|
| EP | 2333482 | 6/2011 |
| EP | 2770298 | 8/2014 |

OTHER PUBLICATIONS

Armstrong, "Operators Manual and Technical Reference for the Z-Beamlet Phase Modulation Failsafe System: Version 1", "Sandia Report", Aug. 2013, pp. 1-78, Publisher: Sanida National Laboratories.

Mikkelsen et al., "Adiabatically widened silicon microrings for improved variation tolerance", "Optics Express", Apr. 21, 2014, pp. 9659-9666, vol. 22, No. 8.

Popovic et al., "Coupling-induced resonance frequency shifts in coupled dielectric multi-cavity filters", "Optics Express", Feb. 6, 2006, pp. 1208-1222, vol. 14, No. 3.

Ye et al., "Applications of Optical Cavities in Modern Atomic, Molecular, and Optical Physics", "Advances in Atomic, Molecular, and Optical Physics", Jul. 21, 2003, pp. 1-84, vol. 49.

US Patent and Trademark Office, "Notice of Allowance", "U.S. Appl. No. 14/708,928", dated May 26, 2017, pp. 1-17.

European Patent Office, "Extended European Search Report from EP Application No. 18161055.1 dated Aug. 7, 2018," from Foreign Counterpart of U.S. Appl. No. 15/591,950, Aug. 7, 2018, pp. 1-8, Published in: EP.

* cited by examiner

SYSTEMS AND METHODS FOR DYNAMIC BIAS OFFSET OPERATION IN RESONATOR FIBER OPTIC GYROSCOPE

U.S. GOVERNMENT LICENSE RIGHTS

This invention was made with Government support under Government Contract No. HR0011-08-C-0019 awarded by DARPA. The Government has certain rights in the invention.

BACKGROUND

The resonator fiber optic gyroscope (RFOG) is a promising contender for next generation navigation gyroscopes. It has the potential to provide a navigation grade solution with the combination of low cost, small package size, and weight. The RFOG uses at least two laser beams as signal light waves, at least one of the laser beams propagates around a resonator coil in the clockwise (CW) direction and the other laser beam in the counter-clockwise (CCW) direction. In the operation of a resonant fiber optic gyroscope (RFOG), it is desirable to tune the frequencies of the laser light sources to the resonance frequencies of the fiber optic ring resonator. In tuning the frequencies, the resonance frequencies may be measured in the CW and CCW direction. The input beam frequencies may be compared and the difference between the input beam frequencies is proportional to the rotation rate of the resonator coil. However, an indicated output may be present when the gyroscope is not rotating. A measured output when no rotation is present contributes to bias instability. One of the major causes of bias instability in RFOGs is backscattered light from one signal light wave propagating in one direction through the resonator to where the light propagates in the other opposite direction through the resonator, where the input signal laser waves, and hence the backscattered, are close to the same frequency. Hence, in this case, the signal light in one direction is co-propagating with the light that is backscattered from the other signal light wave, and they are at the same or nearly same frequency. The presence of backscattered light may decrease the ability to sense rotation at low rotation rates and may increase bias instability.

SUMMARY

Systems and methods for dynamic bias offset operation in resonator fiber optic gyroscopes are provided. In certain embodiments, a resonating fiber optic gyroscope system includes a fiber optic resonator; one or more laser sources, wherein light from the one or more laser sources launches a first optical beam into the fiber optic resonator and a second optical beam into the fiber optic resonator in a direction opposite to the first optical beam; a first servo loop configured to lock the first optical beam to a resonance frequency of the fiber optic resonator, wherein the first servo loop comprises a modulator that modulates the first optical beam at a first resonant tracking frequency; a second servo loop configured to lock the second optical beam to a resonance frequency of the fiber optic resonator, wherein the second servo loop comprises a modulator that modulates the first optical beam at a second resonant tracking frequency, wherein the second optical beam is further modulated by a modulation frequency, wherein the modulation frequency is less than the second resonant tracking frequency; and a filter configured to attenuate signals that result from the interference of the first optical beam with the second optical beam.

DRAWINGS

Embodiments of the present invention can be more easily understood and further advantages and uses thereof more readily apparent, when considered in view of the description of the preferred embodiments and the following figures in which:

FIGS. 1A and 1B are block diagrams illustrating components of a representative resonator fiber optic gyroscope according to embodiments described in the present disclosure;

FIGS. 2-7 are diagrams illustrating frequency modulation of an optical beam in different embodiments of the present disclosure; and FIG. 8 is a flow diagram of a method for dynamic bias offset operation in resonator fiber optic gyroscope in at least one embodiment described in the present disclosure.

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present disclosure provide for dynamic bias offset operation resonator fiber optic gyroscopes. Dynamic bias offset operation may reduce the effect of backscatter on gyro performance. In particular, dynamic bias offset operation reduces bias instability and reduced sensitivity at low rotation rates that result from backscattered light within the gyroscopes. To reduce the effects of backscatter, an offset frequency between the two light waves may be provided. When there is an offset frequency between the input light waves, interference between the light waves may be filtered out. Further, the frequency offset may be dynamic to avoid errors that would arise if there were a fixed offset between the input light waves. To dynamically offset the frequencies, clockwise and counterclockwise waves may be locked onto the same longitudinal resonance frequency for a ring resonator. However, the frequencies may be changed in time such that the frequencies are at the same frequency for only a brief instant. Thus, the interference between the two input waves is almost always at a frequency that is outside the rotation rate signal. As the frequency of the interference is outside the frequency of the rotation rate signal, the interference may be filtered out of the signal, thus increasing the sensitivity at low rotation rates and reducing the bias instability.

FIG. 1 is a block diagram illustrating an exemplary resonator fiber optic gyroscope (RFOG) 100 of one embodiment of the present disclosure. RFOG 100 comprises a first laser source 110 and second laser source 112 each coupled to a fiber optic resonator 120 by at least one optical coupler 126. RFOG 100 further comprises a first servo loop 130, a second servo loop 132, and a dithering processor 135, each of which are discussed in greater detail below.

Figure 1A:
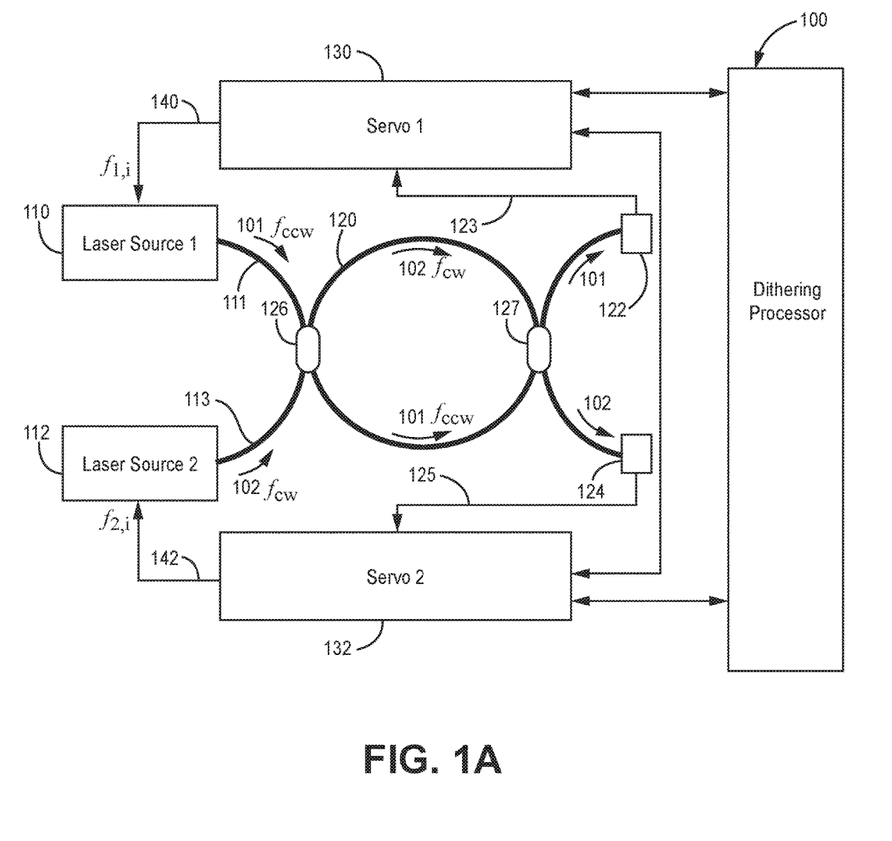
Figure 1B:
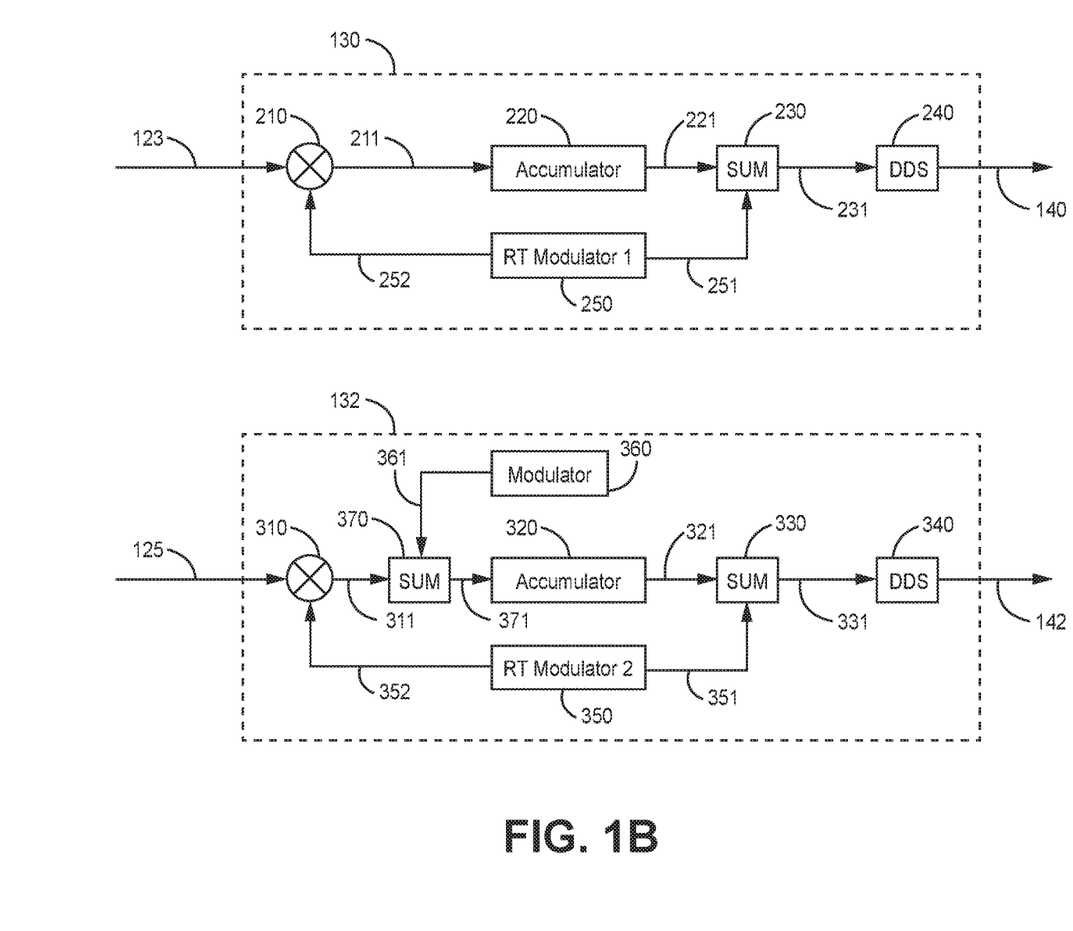

As shown in FIG. 1, first laser source 110 outputs a first optical beam 101 of laser light that is coupled into resonator 120 by coupler 126 and travels around resonator 120 in a first direction. For the example of FIG. 1, the first optical beam 101 is defined as traveling around resonator 120 in a counter-clockwise (CCW) direction. Second laser source 112 outputs a second optical beam 102 of laser light that is coupled into resonator 120 by coupler 126 and travels around resonator 120 in a second direction that is opposite to the first direction traveled by optical beam 101. For the example of FIG. 1, the second optical beam 102 is defined as traveling around resonator 120 in a clockwise (CW) direction. In an alternative implementation, a single laser source provides a laser that is split using optical components into the first and second optical beams. The split first and second optical beams may then be modulated before the first optical beam is coupled into the resonator 120 in the CCW direction and the second optical beam is coupled into the resonator 120 in the CW direction. Both optical beams may also be frequency-modulated prior to being introduced into the resonator. The modulation of the optical beams is shown in FIG. 1b, which illustrates a schematic of devices for determining the center of the resonance ("resonance frequency") of the resonator in each direction. This modulation will be referred to herein as the resonance tracking modulation (RT modulation) which is applied to the optical beams via RT Modulator 1 to the CCW laser and RT Modulator 2, through summing amplifiers 230 and 330 which drive direct digital synthesizers (DDS) 240 and 340, as shown in FIG. 1b. The output of DDS 240 and DDS 340 are used to apply reference frequencies that tune laser source 110 and 112 respectively.

Laser sources 110 and 112 may each be controlled by respective servo loops 1 and 2 (shown at 130 and 132, and in further detail in FIG. 1b) where the laser source 110 introduces light into the resonator 120 in the CCW direction at a CCW input frequency and the laser source 112 introduces light into the resonator 120 in the CW direction at a CW input frequency. In conventional resonators, the lasers may be controlled by the servo loops 1 and 2 such that the lasers may be kept substantially at the resonant frequency for the resonator 120. The location of the resonance centers in the CCW and CW directions of the resonator are identified by the servos by applying resonance tracking frequency modulations in RT modulator 1 250 and RT modulator 2 350, respectively, and demodulating the photodetector signals 123 and 125 respectively in mixers 210 and 310 respectively to determine if the first optical beam 101 and the second optical beam 102 are on resonance. When the first optical beam 101 and the second optical beam 102 are on resonance, or the optical light beams are on resonance on a time-averaged basis, the time average of the signal content in signals 123 and 125 at the resonance tracking frequencies are zero. If the time average of the signal content in signals 123 and 125 at the resonance tracking frequencies are not zero then the servos adjust the center frequency of the first optical beam 101 and the second optical beam 102 so that their time-averaged center frequencies are aligned to the resonances in the two respective directions, and hence the time average of the signal content in signals 123 and 125 at the resonance tracking frequencies will be forced to zero. This is assured by digital accumulators 220 and 320 respectively having zero inputs so they do not accumulate to higher or lower values in their outputs 221 and 321. The demodulators 210 and 310 are typically mixers using reference signals from the 252 and 352 respectively from RT modulator 1 250 and RT modulator 2 350 respectively. At low rotation rates, both the CCW input frequency and the CW input frequency would be tuned to the resonance frequencies of the resonator 120 which are approximately equal for low rotation rate. However, if light backscatters from one direction into the other direction, the rotation rate output may contain a large error signal at the difference between the input frequencies. The large error signal may be in the signal bandwidth where rotation rates of interest are measured. For example, the error signal due to backscattered light may be in the band that includes DC up to 100 Hz. Thus, the backscattered light may lead to the measurement of an incorrect rotation rate. Furthermore, the servo loops 1 and 2 may react to the error signal and cause the input frequencies to be locked to one another, which results in a "deadband" where the gyroscope is unable to measure low rotation rates.

In embodiments described herein, to avoid errors in the low rotation rates, at least one of the input frequencies may be modulated by another modulation (in addition to the resonance tracking modulations) such that the input frequencies are not equal to each other. Thus, the difference between the input frequencies may be greater than a frequency (i.e. >100 Hz) that would allow filtering of an error signal that results from the interaction of the light beams having the different input frequencies as the light propagates around the resonator 120 in different directions except for a small amount of time as the frequency of the light beam transitions from one frequency to a second frequency.

In one exemplary implementation, one of the optical beams (either 101 or 102) may be maintained at a resonance frequency of the resonator 120. For example, laser source 110 launches a first optical beam 101 into resonator 120 at a specific optical input frequency. At that input frequency, the first optical beam 101 will exhibit a specific wavelength, (which for laser light can be a wavelength on the order of 1.5 microns, for example). When the first optical beam 101 is tuned to a frequency such that exactly an integer multiple of wavelengths are propagating around resonator 120, then optical beam 101 is said to be operating at a resonance frequency, or a resonance center frequency, or at resonance center, of the resonator 120 (which can also be referred to as one of the resonant modes of the resonator 120). At this frequency, with each pass that optical beam 101 travels around the loop of resonator 120, the optical beam is in phase with its previous pass and the optical power from each pass accumulates to a peak resonant intensity. Any deviation in the input frequency from a resonance frequency will cause optical power within resonator 120 to sum to less than the peak resonant intensity. In this case, when the first optical beam 101 is at resonance center, the signal 123 from photodetector 122 will have no signal content at the frequency of the resonance tracking frequency modulation provided by RT Modulator 1 250.

Further, when the frequency of one of the optical beams is kept at the resonance frequency of the resonator 120, the frequency of a second optical beam that propagates in the opposite direction of the optical beam propagating at the resonant frequency may be frequency modulated such that it is dithered between different off-resonant frequencies. The difference between the frequencies of the two different optical beams may be greater than a filterable frequency throughout most of the operation. For example, the filterable frequency may be 100 Hz, thus the difference between the different optical beams may be greater than 100 Hz. Also, the average frequency of the off resonant optical beam is on average locked to the resonance frequency for its direction of propagation. That is the frequency of the off resonance optical beam switches from a first frequency that is greater than the resonance frequency to a second frequency that is less than the resonance frequency at such a rate that the average frequency for the off-resonance optical beam is on average at the resonance frequency. In this case, as shown in FIG. 1b for servo block 132, modulator 360 drives a modulation signal 361 into summing amplifier 370 at a modulation frequency which switches the off resonant laser beam alternatively from one side of the resonance to the other. In this case, signal 125 will have a frequency component at the resonance tracking modulation frequency that is in phase with resonance tracking modulation reference signal 352 substantially half the time, and that is 180 degrees out of phase with resonance tracking modulation reference signal 352 substantially half the time. The time average of demodulator 310 is thus zero, over one complete period of modulation signal 361. In this implementation, the magnitude of the difference between the first frequency and the resonance frequency and the difference between the second frequency and the resonance frequency is substantially equal and the frequency of the off-resonance optical beam is above and below the resonance frequency for substantially the same amount of time. Alternatively, the magnitude of the difference between the first frequency and the resonance frequency and the difference between the second frequency and the resonance frequency may be different. When the magnitude of the differences are not equal, the time that the off-resonant optical beam is at the first frequency and at the second frequency will likewise be not equal such that the off-resonant optical beam is "on-average" at the resonant frequency, and the time average of the output of demodulator 310 will be zero over an integer number of cycles of the modulation signal 361. For example, laser source 110 launches optical beam 101 into resonator 120 at a specific optical frequency that is at the resonance frequency. Conversely, laser source 112 launches optical beam 102 into resonator 120 at an off-resonance frequency that is greater than the resonance frequency. The laser source 112 may then be controlled such that the off-resonance frequency switches to the second frequency that is lower than the resonance frequency.

In an alternative implementation, both the frequency of the first laser source 110 and the second laser source 112 are switched between states that are off the resonance frequency. To switch the frequencies of both the first laser source 110 and the second laser source 112 off of the resonance frequency, both of servo loops 130 and 132 in FIG. 1 may be similar to servo loop 132 as represented in FIG. 1B. In certain implementations, the modulator 360 may provide signals to both of servo loops 130 and 132 except the modulation signal from modulator 360 may be inverted before modulation within servo loop 130, such that the modulation of the light beam in servo loop 130 is 180° out of phase with the modulation of the light beam in servo loop 132. When the first laser source 110 and the second laser source 112 are both off the resonance frequency, the first laser source 110 will be above the resonance frequency when the second laser source 112 is below the resonance frequency. Further, the frequency of the first laser source 110 will switch to a frequency below the resonance frequency at the same time the frequency of the second laser source 112 switches to a frequency that is above the resonance frequency. However, while both the first laser source 110 and the second laser source 112 are not at the resonance frequency except for a brief moment when switching frequencies, they are on-average at the resonance frequency. Further, the difference between the off-resonant frequencies of the first laser source 110 and the second laser source 112 is greater than a frequency level that permits filtering of signals that are produced by the interaction of the first laser 101 and the second laser 102.

In certain implementations, to control the first laser source 110 and the second laser source 112, the first laser source 110 and the second laser source 112 may be controlled by respective servo loops (130 and 132) such that the first optical beam 101 and the second beam 102 may be locked to the different frequencies with respect to each other. As stated above, one of the first optical beam 101 and the second optical beam 102 may be locked to the resonance frequency. For example, the first optical beam 101 may be locked to a resonance frequency. Adjacent longitudinal resonant frequencies are separated from each other based on a function of the free spectral range (FSR) of resonator 120. In a further implementation, a dithering processor 135 may control the frequency modulation provided by the servo 1 and servo 2.

In certain implementations, the frequency of optical beam 101 is locked to a resonance frequency by the first resonance switching servo loop 130 while the frequency of optical beam 102 is switched between off-resonance frequencies by the second resonance switching servo loop 132 such that the average frequency of optical beam 102 is on resonance. In one embodiment, this is accomplished by operating servo loops 130 and 132 as frequency locked loops. More specifically, the CCW optical beam is frequency or phase modulated to interrogate the resonator. A portion of the CCW propagating optical beam 101 may be coupled out of the resonator 120 by an optical coupler 127 and delivered to a first photodetector 122, which measures the optical intensity of optical beam 101. From this measurement, photodetector 122 produces a resonance tracking signal 123, which is an electrical signal that varies as a function of the measured optical intensity. When the average optical frequency of the CCW beam is on resonance the photodetector output will not have a frequency component at the resonance tracking modulation frequency and the output of demodulator 210 will be zero. The photodetector output signal component at the resonance tracking modulation frequency will be proportional to average optical frequency deviations from the resonance frequency. Deviation from the average resonance frequency produces a tracking error at the resonance tracking modulation frequency reflected in resonance tracking signal 123. First resonance switching servo loop 130 inputs the resonance tracking signal 123 at the resonance tracking modulation frequency and outputs a control signal 140 to laser source 110 that adjusts the frequency of optical beam 101 to drive the time averaged output of the demodulator over the modulation frequency period (i.e., control signal 140 drives optical beam 101 to the desired average resonance frequency). Further, in some implementations, the control signal 140 drives the frequency of the optical beam 101 to alternate between a first frequency above and a second frequency below the resonance frequency. In the same way, a portion of the CW propagating optical beam 102 is coupled out of resonator 120 by optical coupler 127 and delivered to a second photodetector 124, which measures the optical intensity of optical beam 102. From this measurement, photodetector 124 produces a resonance tracking signal 125, which is an electrical signal that varies as a function of the measured optical intensity. When the average optical frequency of the CW beam is on resonance the photodetector output will not have a frequency component at the resonance tracking modulation frequency. The photodetector output signal component at the resonance tracking modulation frequency will be proportional to the average optical frequency deviations from the resonance frequency. Deviation from the average resonance frequency produces a tracking error at the resonance tracking modulation frequency reflected in resonance tracking signal 125. The second resonance switching servo loop 132 inputs the resonance tracking signal 125 and outputs a control signal 142 to laser source 112 that adjusts the frequency of optical beam 102 to drive the tracking error at the resonance tracking modulation frequency to zero (i.e., control signal 142 drives optical beam 102 to the desired average resonance frequency). Further, in some implementations, the control signal 142 drives the frequency of the optical beam 102 to alternate between different frequencies above and below the resonance frequency, while driving the optical beam 102 to be at the average resonance frequency. In this case the tracking error at the resonance tracking modulation frequency will average to zero after the beam frequency alternates between being above and below resonance. As noted above, at least one (or both) of the optical beams propagates at a frequency that is off resonance on an instantaneous basis, but is on-resonance on average.

Figure 2:
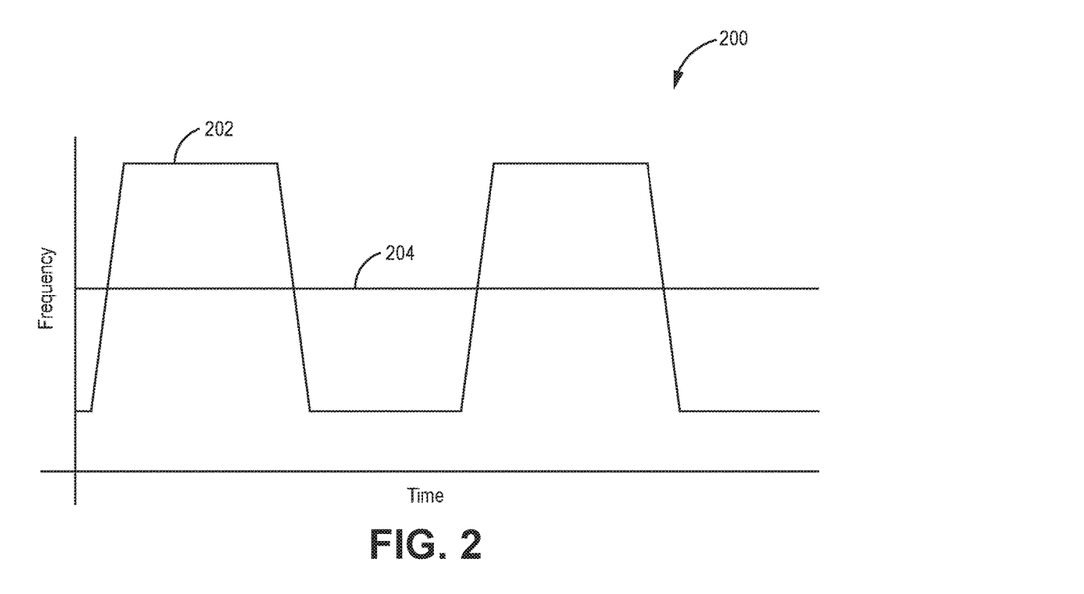

FIG. 2, illustrates a graph 200, showing the frequencies for optical beams 101 and 102, where only one of optical beams 101 and 102 is maintained at the resonance frequency as the optical beams propagate through the resonator 120 for the case of zero rotation rate or negligible rotation rate. The first optical beam is modulated by a resonance tracking modulation (not shown) about a resonance frequency 204. The frequency 204, about which the first optical beam is modulated remains relatively constant because the first optical beam may be locked to the resonance frequency of the resonator 120. Further, the second optical beam frequency 202 of a second optical beam may be dithered such that the resonance tracking modulation modulates the second optical beam about a first frequency that is greater than the resonance frequency for the resonator 120 and a second frequency that is less than the resonance frequency for the resonator 120. As illustrated, at times when the frequency 202 is not transitioning between the first frequency and the second frequency, the difference between the frequency 202 and the resonance frequency, or the first optical beam frequency 204 is sufficiently large enough to enable filtering an error signal that results from backscattered light from the interaction of the first and second optical beams. While not illustrated in FIG. 2, both the first optical beam and the second optical beam may also be modulated by a resonance tracking modulation that modulates the first and second optical beam at a faster frequency than the first and second frequencies as a means of determining what the resonance frequencies, or resonance frequency centers, are.

In at least one implementation, when the second optical beam frequency 202 transitions from being above the first optical beam frequency 204 to being below the first optical beam frequency 204, the light in both optical beams will briefly interact with one another such that the backscattered light produces an error signal that may be difficult to filter out, such that errors may be produced when the second optical beam frequency 202 transitions from one frequency to another. However, the effects of the errors that arise during the transition between the first and second frequencies is reduced due to the brevity of the interaction. In at least one implementation, when the dithered frequency is a square wave, the dithering of the second optical beam may introduce transients when transitioning between the upper and lower dithered frequencies. To prevent the transients from affecting the servos, the output from the resonator may be gated out during and immediately after the second optical beam frequency 202 transitions from being above the resonance frequency to being below the resonance frequency or transitions from being below the resonance frequency to being above the resonance frequency. When the data is gated out, the output of the resonator may be replaced by average measurements that had previously been acquired.

In certain embodiments, the rotation of the resonator may cause the difference between the first optical beam frequency 204, which is locked to the resonance frequency of the resonator to become closer towards either the upper or lower dithered frequency 202 of the second optical beam. To prevent the backscattered signal from affecting the output, the magnitude of the dither may be increased when the resonator is experiencing rotation. For example, a gyroscope system may prevent the frequency of the CCW signal from being within 100 Hz of the CW signal except when a dithered frequency transitions from one frequency to another. However, when the gyroscope experiences rotation, the difference between the frequencies of the CCW signal and the CW signal may become less than 100 Hz. The gyroscope system may change the dithering frequencies of the dithered optical beam such that the difference between the frequencies is greater than 100 Hz.

Figure 3:
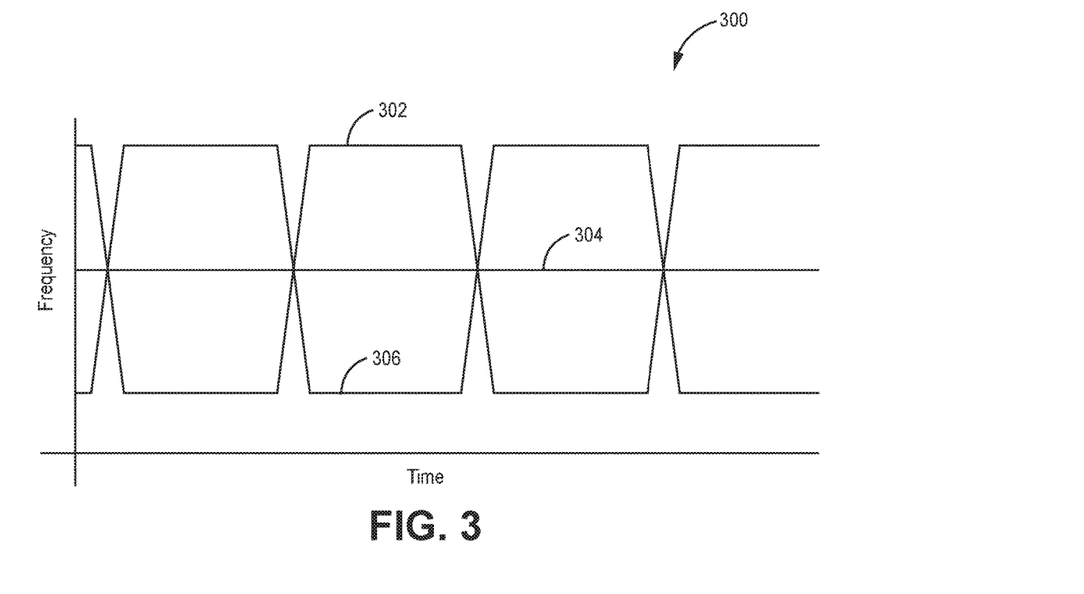

FIG. 3, illustrates a graph 300, where the frequencies for both optical beams 101 and 102 are dithered about the resonance frequency of the resonator 120 as the optical beams propagates through the resonator 120 for the case of zero rotation rate or negligible rotation rate. As shown, the first optical beam frequency 306 of a first optical beam is dithered between a first frequency that is greater than the resonance frequency 304 and a second frequency that is less than the resonance frequency 304 of the resonator 120. For example, the first optical beam frequency 306 may be dithered by a square wave at a rate of 100 Hz where the first frequency is 500 Hz above the resonance frequency 304 and the second frequency is 500 Hz below the resonance frequency. Further, the second optical beam frequency 302 of a second optical beam may be dithered between a first frequency that is greater than the resonance frequency 304 and a second frequency that is less than the resonance frequency 304 but 180° out of phase with the first optical beam frequency 306. For example, the second optical beam frequency 302 may also be dithered by a square wave at a rate of 100 Hz where the first frequency is 500 Hz below the resonance frequency 304 and the second frequency is 500 Hz above the resonance frequency. As illustrated, at times when the frequency 302 is not transitioning between the first frequency and the second frequency, the difference between the frequency 302 and the resonance frequency, or the first optical beam frequency 304 is sufficiently large enough to enable filtering an error signal that results from backscattered light from the interaction of the first and second optical beams. Further, while not illustrated, in FIG. 3, both the first optical beam and the second optical beam may also be modulated by a resonance tracking modulation that modulates the first and second optical beam at a faster frequency than the first and second frequencies.

In at least one implementation, when the second optical beam frequency 302 transitions from a first frequency to a second frequency and the first optical beam frequency 304 transitions from the second frequency to the first frequency, the light in both optical beams may briefly interact with one another such that the backscattered light produces an error signal that may be difficult to filter out, such that errors may be produced when the second optical beam frequency 302 and the first optical beam frequency transition from one frequency to another. However, the effects of the errors that arise during the transition between the first and second frequencies is reduced due to the brevity of the interaction. Further, in at least one implementation, when the dithering is controlled by a square wave as shown in FIG. 3, the dithering of the first and second optical beams may introduce transients when transitioning between the upper and lower dithered frequencies. To prevent the transients from affecting the servos, the output from the resonator may be gated out during and immediately after the first and second optical beam frequencies transition from being above the resonance frequency 304 to being below the resonance frequency 304 or transitions from being below the resonance frequency 304 to being above the resonance frequency 304. When the data is gated out, the output of the resonator may be replaced by average measurements based on previously acquired measurements.

Figure 4:
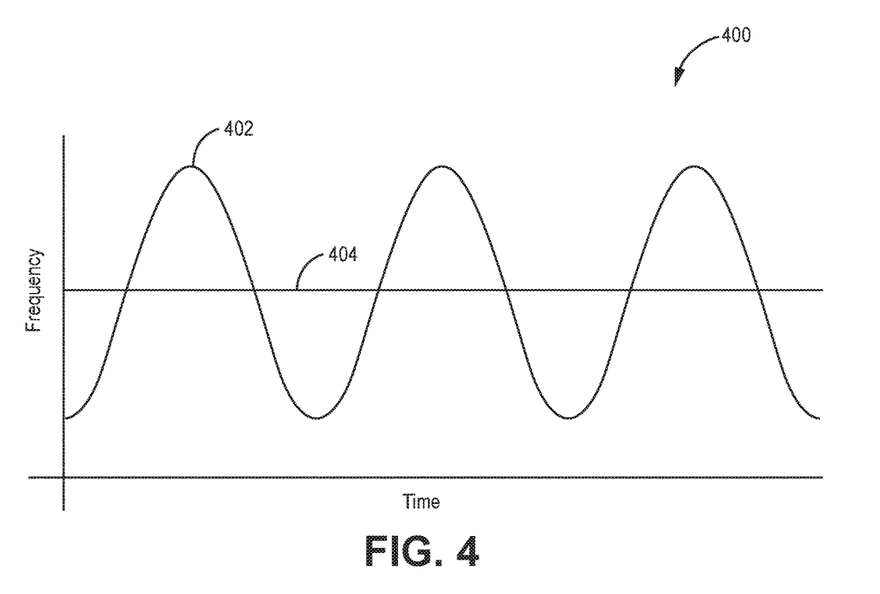

FIG. 4 illustrates a graph 400, showing the frequencies for optical beams 101 and 102, where only one of optical beams 101 and 102 is maintained at the resonance frequency as the optical beams propagates through the resonator 120 for the case of zero rotation rate or negligible rotation rate. As shown, the first optical beam is modulated by a resonance tracking modulation about a frequency 404. The frequency 404, about which the first optical beam is modulated remains relatively constant because the first optical beam may be locked to the resonance frequency of the resonator 120. Further, the second optical beam frequency 402 of a second optical beam may be dithered such that the resonance tracking modulation modulates the second optical beam to a first frequency that is greater than the resonance frequency for the resonator 120 and to a second frequency that is less than the resonance frequency for the resonator 120, where the average frequency of the second optical beam is locked to the resonance frequency. For example, the second optical beam frequency may be dithered by a sinusoid at a frequency of 100 Hz where the first frequency is 500 Hz above the resonance frequency and the second frequency is 500 Hz below the resonance frequency. As illustrated, at times when the frequency 402 is not transitioning between the first frequency and the second frequency, the difference between the frequency 402 and the resonance frequency, or the first optical beam frequency 404 is sufficiently large enough to enable filtering an error signal that results from backscattered light from the interaction of the first and second optical beams.

In at least one implementation, when the second optical beam frequency 402 transitions from being above the first optical beam frequency 404 to being below the first optical beam frequency 404, the light in both optical beams may briefly interact with one another such that the backscattered light produces an error signal that may be difficult to filter out, such that errors may be produced when the second optical beam frequency 402 transitions from one frequency to another. As the dither is sinusoidal, the time when errors are produced due to the interaction of the first and second optical beams may be reduced by either increasing the frequency or amplitude of the dither. Further, as the dither is sinusoidal, the dithering of the second optical beam may not introduce transients as are introduced when the dither is implemented using a square wave.

In certain embodiments, the rotation of the resonator may cause the difference between the first optical beam frequency 404, which is locked to the resonance frequency of the resonator to become closer towards either the upper or lower dithered frequency 402 of the second optical beam. To prevent the backscattered signal from affecting the output, the magnitude of the dither may be increased when the resonator is experiencing rotation. For example, a gyroscope system may prevent the frequency of the CCW signal from being within 100 Hz of the CW signal except when a dithered frequency transitions from one frequency to another. However, when the gyroscope experiences rotation, the difference between the frequencies of the CCW signal and the CW signal may become less than 100 Hz. The gyroscope system may change the dithering frequencies of the dithered optical beam such that the difference between the frequencies is greater than 100 Hz.

Figure 5:
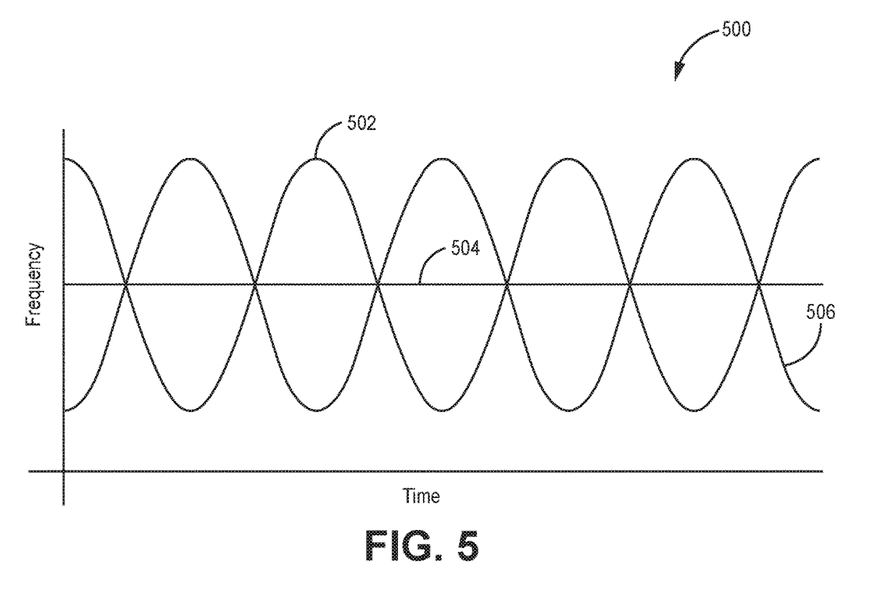

FIG. 5, illustrates a graph 500, where the frequencies for both optical beams 101 and 102 are dithered about the resonance frequency of the resonator 120 as the optical beams propagates through the resonator 120, and again, for the case of zero rotation rate or negligible rotation rate. As shown, the first optical beam frequency 506 of a first optical beam is sinusoidally dithered between a first frequency that is greater than the resonance frequency 504 and a second frequency that is less than the resonance frequency 504 of the resonator 120. For example, the first optical beam frequency 506 may be sinusoidally dithered by at a rate of 100 Hz where the first frequency is 500 Hz above the resonance frequency 504 and the second frequency is 500 Hz below the resonance frequency. Further, the second optical beam frequency 502 of a second optical beam may be sinusoidally dithered between a first frequency that is greater than the resonance frequency 504 and a second frequency that is less than the resonance frequency 504 but 180° out of phase with the first optical beam frequency 506. For example, the first optical beam frequency 506 may also be sinusoidally dithered at a rate of 100 Hz where the first frequency is 500 Hz above the resonance frequency 504 and the second frequency is 500 Hz below the resonance frequency. As illustrated, at times when the frequency 502 is not transitioning between the first frequency and the second frequency, the difference between the frequency 502 and the resonance frequency, or the first optical beam frequency 504 is sufficiently large enough to enable filtering an error signal that results from backscattered light from the interaction of the first and second optical beams.

In at least one implementation, when the second optical beam frequency 502 transitions from a first frequency to a second frequency and the first optical beam frequency 504 transitions from the second frequency to the first frequency, the light in both optical beams may briefly interact with one another such that the backscattered light produces an error signal that may be difficult to filter out, such that errors may be produced when the second optical beam frequency 502 and the first optical beam frequency 506 transition from one frequency to another. However, the effects of the errors that arise during the transition between the first and second frequencies is reduced due to the brevity of the interaction. As the dithering is sinusoidal, the time when errors are produced due to the interaction of the first and second optical beams may be reduced by either increasing the frequency or amplitude of the dither. Further, as the dither is sinusoidal, the dithering of the second optical beam may not introduce transients as are introduced when the dither is implemented using a square wave.

Figure 6:
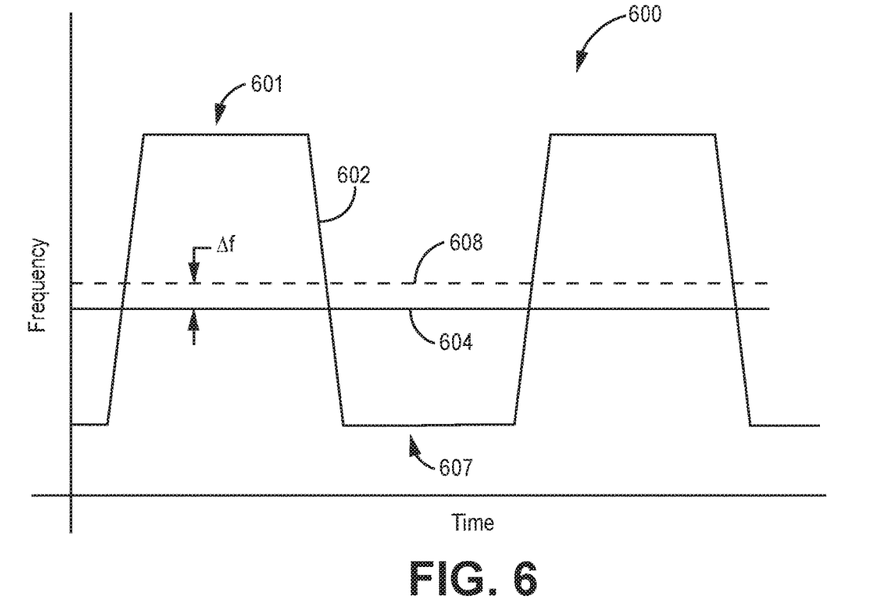

FIG. 6 illustrates a graph 600, showing the frequencies for optical beams 101 and 102, where only one of optical beams 101 and 102 is maintained at its resonance frequency as the optical beams propagate through the resonator 120 when the resonator experiences rotation. As shown, the resonance frequencies of the resonator in the CW and CCW directions are shifted by a frequency shift Δf due to rotation. The first optical beam is modulated by a resonance tracking modulation (not shown) about a frequency 604. The frequency 604, about which the first optical beam is modulated remains relatively constant because the first optical beam may be locked to the resonance frequency center of the resonator 120 in its direction. Further, the second optical beam traveling in the second direction inside the resonator, of frequency 602, of a second optical beam may be dithered such that the resonance tracking modulation (not shown) modulates the second optical beam about a first frequency 601 that is greater than the resonance center frequency 608 for the resonator 120 and a second frequency 607 that is less than the resonance center frequency for the resonator 120, where the average frequency of the second optical beam is locked to the center frequency of the resonance 608. The resonance center frequency in 608 is shifted from the other resonance center frequency 604 by a frequency difference resulting from inertial rotation of the gyro. For example, the second optical beam frequency may be dithered by a sinusoid at a frequency of 100 Hz where the first frequency is 500 Hz above the resonance frequency (same as "resonance frequency center") and the second frequency is 500 Hz below the resonance frequency. As illustrated, at times when the frequency 602 is not transitioning between the first frequency and the second frequency, the difference between the frequency 602 and the resonance frequency, or the first optical beam frequency 604 is sufficiently large enough to enable filtering an error signal that results from backscattered light from the interaction of the first and second optical beams.

Figure 7:
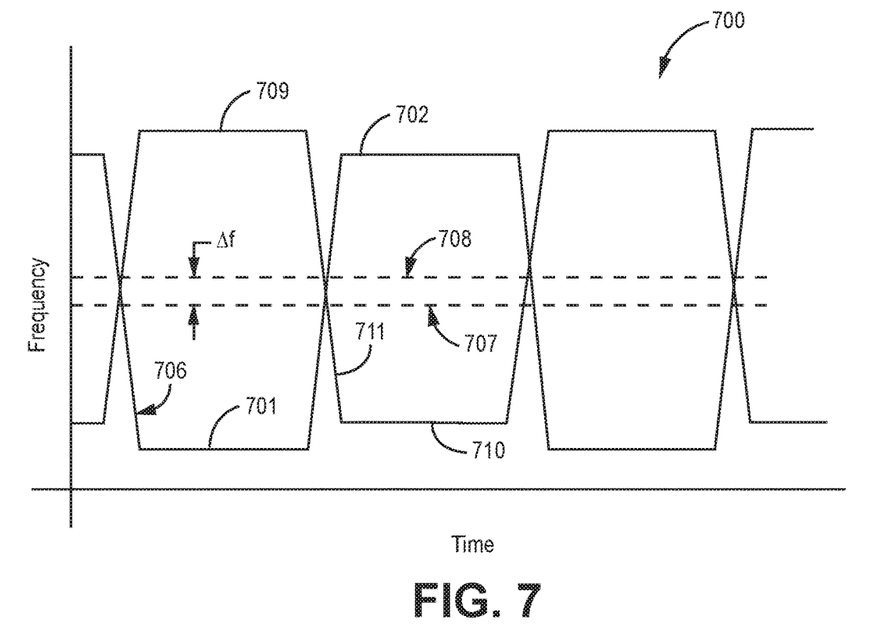

FIG. 7, illustrates a graph 700, where the frequencies for both optical beams 101 and 102 are dithered about the resonance frequency of the resonator 120 as the optical beams propagates through the resonator 120, when the resonator experiences rotation and the resonance frequencies of the resonator in the CW and CCW directions are shifted by a frequency shift Δf due to rotation. As shown, the first optical beam frequency 706 of a first optical beam is square-wave dithered between a first frequency 702 that is greater than the resonance frequency 707 and a second frequency 701 that is less than the resonance frequency 707 of the resonator 120. For example, the first optical beam frequency 706 may be square-wave dithered at a rate of 100 Hz where the first frequency is 500 Hz above the resonance frequency 707 and the second frequency is 500 Hz below the resonance frequency. Further, the second optical beam frequency 711 of a second optical beam may be square-wave dithered between a first frequency 709 that is greater than the resonance frequency 708 and a second frequency 710 that is less than the resonance frequency 708 but 180° out of phase with the square wave dither waveform that is applied to the first optical beam frequency 706. For example, the first optical beam frequency 706 may also be square-wave dithered at a rate of 100 Hz where the first frequency is 500 Hz above the resonance frequency 707 and the second frequency is 500 Hz below the resonance frequency. As illustrated, at times when the frequency 711 is not transitioning between the first frequency and the second frequency, the difference between the frequency 711 and the optical beam frequency 706 is sufficiently large enough to enable filtering an error signal that results from backscattered light from the interaction of the first and second optical beams at frequencies 706 and 711, respectively. As illustrated, as the resonant frequencies 707 and 708 are shifted from each other due to rotation of the gyroscope by an amount Δf, the upper and lower frequencies extremes of the frequency modulation of the first optical beam frequency 706 and second optical beam frequency 711 also change in accordance such that resulting backscattered light may be filtered out of measurements. As noted earlier, other dithering waveforms may be used such as sinusoidal modulation, to reduce transients in signal processing electronics and servo systems.

Figure 8:
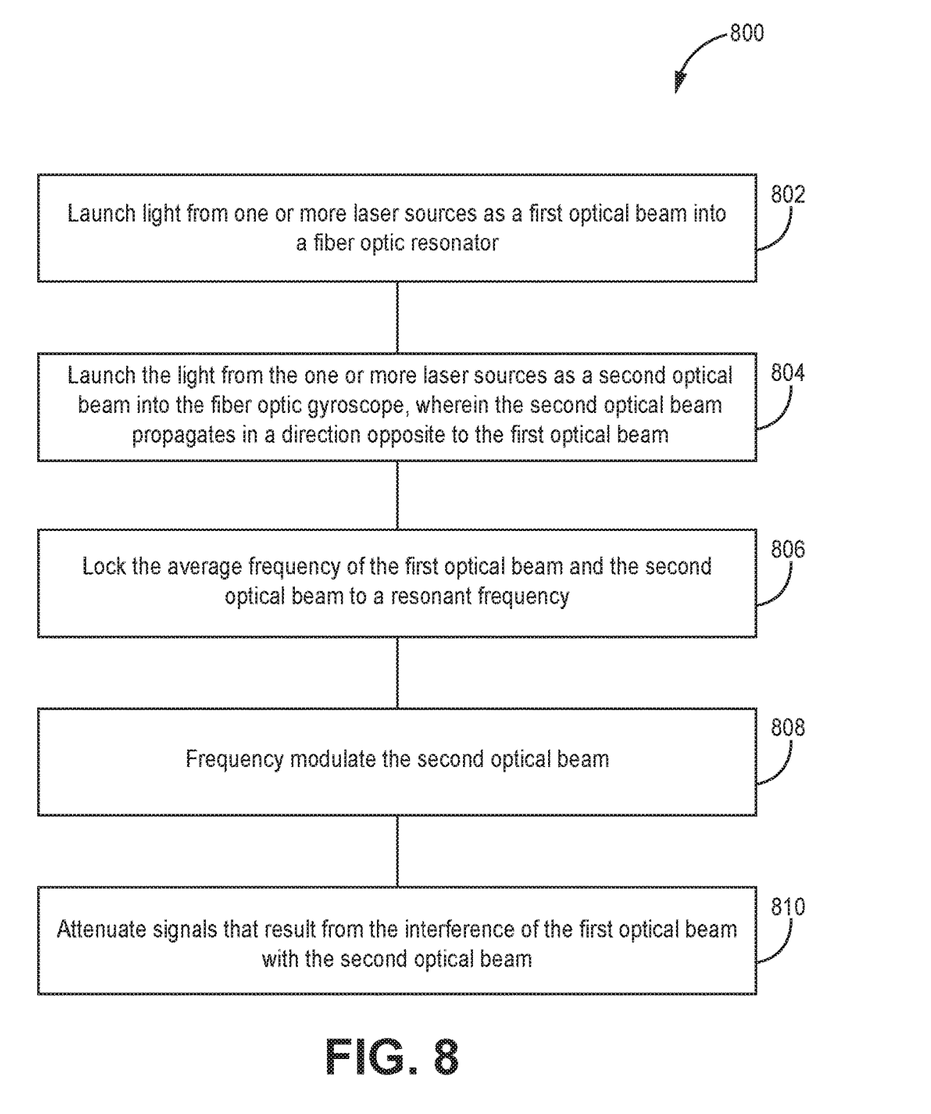

FIG. 8 is a flow diagram illustrating a method 800 for dynamic bias offset operation in resonator fiber optic gyroscope. Method 800 begins at 802, where light from one or more laser sources is launched as a first optical beam into a fiber optic resonator. For example, a laser source may produce a first optical beam that is coupled into the fiber optic resonator to propagate in the CCW direction. Method 800 then proceeds to 804, where light from the one or more laser sources is launched as a second optical beam into the fiber optic gyroscope, where the second optical beam propagates in a direction opposite the first optical beam. For example, a second laser source may produce a second optical beam that is coupled into the fiber optic resonator to propagate in the CW direction. In at least one implementation, the first optical beam and the second optical beam are produced by the same laser source, and optics then introduce the different optical beams from the single laser source into the fiber optic resonator to propagate in different directions within the resonator.

In certain embodiments, method 800 then proceeds at 806, where the average frequency of the first optical beam and the second optical beam are locked to a resonance frequency. For example, the one or more laser source may be coupled to one or more servos. The servos send control signals to the one or more laser sources to control the average frequency of the light produced by the one or more lasers. The method 800 then proceeds at 808, where the second optical beam is frequency modulated. For instance, the second optical beam may be frequency modulated such that the second optical beam is dithered about the resonance frequency. Method 800 then proceeds at 810, where signals that result from the interference of the first optical beam with the second optical beam are attenuated. As the second optical beam is dithered, the interaction of the first optical beam with the second optical beam may be due to backscattered light. This backscattered light may produce a signal at the photodetector at a filterable frequency. The filter may then remove the signal produced from the backscattered light. By removing the error due to the backscattered signal, bias errors and low rotation rate errors may be reduced.

Example Embodiments

Example 1 includes a resonating fiber optic gyroscope system, the system comprising: a fiber optic resonator; one or more laser sources, wherein light from the one or more laser sources launches a first optical beam into the fiber optic resonator and a second optical beam into the fiber optic resonator in a direction opposite to the first optical beam; a first servo loop configured to lock the first optical beam to a resonance frequency of the fiber optic resonator, wherein the first servo loop comprises a modulator that modulates the first optical beam at a first resonant tracking frequency; a second servo loop configured to lock the second optical beam to a resonance frequency of the fiber optic resonator, wherein the second servo loop comprises a modulator that modulates the second optical beam at a second resonant tracking frequency, wherein the second optical beam is further modulated by a modulation frequency, wherein the modulation frequency is less than the second resonant tracking frequency; and a filter configured to attenuate signals that result from the interference of the first optical beam with the second optical beam.

Example 2 includes the system of Example 1, wherein the first optical beam is further modulated by a second modulation frequency, wherein the second modulation frequency waveform is 180 degrees out of phase with the modulation frequency.

Example 3 includes the system of any of Examples 1-2, wherein the second optical beam is frequency modulated by a square wave.

Example 4 includes the system of Example 3, wherein output from the fiber optic resonator is gated during a square wave transition between different frequencies for the modulation frequency and immediately following the square wave transition.

Example 5 includes the system of Example 4, wherein a processor replaces the gated output from the resonator with previously acquired average measurements.

Example 6 includes the system of any of Examples 4-5, wherein the difference between the frequency of the first optical beam and the second optical beam is greater than 100 Hz except during the square wave transition.

Example 7 includes the system of any of Examples 1-6, wherein the second optical beam is frequency modulated by a sinusoid.

Example 8 includes the system of any of Examples 1-7, wherein frequency modulation about the resonant frequency is changed when the fiber optic resonator experiences rotation.

Example 9 includes the system of Example 8, wherein the magnitude of the frequency modulation is increased when the fiber optic resonator experiences rotation.

Example 10 includes a method for dynamic bias offset operation in a resonator fiber optic gyroscope, the method comprising: launching light from one or more laser sources as a first optical beam into a fiber optic resonator; launching the light from the one or more laser sources as a second optical beam into the fiber optic gyroscope, wherein the second optical beam propagates in a direction opposite to the first optical beam; locking the average frequency of the first optical beam and the second optical beam to a resonance frequency through modulating the first optical beam with a first resonant tracking frequency and modulating the second optical beam with a second resonant tracking frequency; frequency modulating the second optical beam by a modulation frequency, wherein the modulation frequency is less than the second resonant tracking frequency; and attenuating signals that result from the interference of the first optical beam with the second optical beam.

Example 11 includes the method of Example 10, further comprising frequency modulating the first optical beam by a second modulation frequency, wherein the first optical beam is frequency modulated 180 degrees out of phase with the frequency modulated second optical beam by the second modulation frequency.

Example 12 includes the method of any of Examples 10-11, wherein frequency modulating the second optical beam comprises frequency modulating the second optical beam with a square wave.

Example 13 includes the method of Example 12, further comprising gating output from the fiber optic resonator during a square wave transition between different frequencies for the modulation frequency and immediately following the square wave transition.

Example 14 includes the method of Example 13, further comprising replacing the gated output from the resonator with previously acquired average measurements.

Example 15 includes the method of any of Examples 13-14, wherein the difference between the frequency of the first optical beam and the second optical beam is greater than 100 Hz except during the square wave transition.

Example 16 includes the method of any of Examples 10-15, wherein the second optical beam is frequency modulated by a sinusoid waveform.

Example 17 includes the method of any of Examples 10-16, wherein frequency modulation about the resonant frequency is changed when the fiber optic resonator experiences rotation.

Example 18 includes the method of Example 17, wherein the magnitude of the frequency modulation is increased when the fiber optic resonator experiences rotation.

Example 19 includes a resonating fiber optic gyroscope system, the system comprising: a fiber optic resonator; one or more laser sources, wherein light from the one or more laser sources launches a first optical beam into the fiber optic resonator and a second optical beam into the fiber optic resonator in a direction opposite to the first optical beam; a first photodetector, wherein the first optical beam is incident upon the first photodetector, the first photodetector providing a first signal; a second photodetector, wherein the second optical beam is incident upon the second photodetector, the second photodetector providing a second signal; a first servo loop configured to lock the first optical beam to a resonant frequency of the fiber optic resonator based on the first signal, wherein the first servo loop comprises a modulator that modulates the first optical beam at a first resonant tracking frequency; and a second servo loop configured to lock the second optical beam to a resonance frequency of the fiber optic resonator based on the second signal, wherein the second servo loop comprises a modulator that modulates the first optical beam at a second resonant tracking frequency, wherein the second optical beam is further modulated by a modulation frequency, wherein the modulation frequency is less than the second resonant tracking frequency.

Example 20 includes the system of Example 19, further comprising a filter configured to attenuate signals that result from the interference of the first optical beam with the modulated second optical beam.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A resonating fiber optic gyroscope system, the system comprising:
 a fiber optic resonator;
 one or more laser sources, wherein light from the one or more laser sources launches a first optical beam into the fiber optic resonator and a second optical beam into the fiber optic resonator in a direction opposite to the first optical beam;
 a first servo loop configured to lock the first optical beam to a resonance frequency of the fiber optic resonator, wherein the first servo loop comprises a modulator that modulates the first optical beam at a first resonant tracking frequency;

a second servo loop configured to lock the second optical beam to a resonance frequency of the fiber optic resonator, wherein the second servo loop comprises a modulator that modulates the second optical beam at a second resonant tracking frequency, wherein the second optical beam is further modulated by a modulation frequency, wherein the modulation frequency is less than the second resonant tracking frequency; and a filter configured to attenuate signals that result from interference of the first optical beam with the second optical beam.

2. The system of claim 1, wherein the first optical beam is further modulated by a second modulation frequency, wherein the second modulation frequency waveform is 180 degrees out of phase with the modulation frequency.

3. The system of claim 1, wherein the second optical beam is frequency modulated by a square wave.

4. The system of claim 3, wherein output from the fiber optic resonator is gated during a square wave transition between different frequencies for the modulation frequency and immediately following the square wave transition.

5. The system of claim 4, wherein a processor replaces the gated output from the resonator with previously acquired average measurements.

6. The system of claim 4, wherein the difference between the frequency of the first optical beam and the second optical beam is greater than 100 Hz except during the square wave transition.

7. The system of claim 1, wherein the second optical beam is frequency modulated by a sinusoid.

8. The system of claim 1, wherein frequency modulation about the resonant frequency is changed when the fiber optic resonator experiences rotation.

9. The system of claim 8, wherein the magnitude of the frequency modulation is increased when the fiber optic resonator experiences rotation.

10. A method for dynamic bias offset operation in a resonator fiber optic gyroscope, the method comprising:
launching light from one or more laser sources as a first optical beam into a fiber optic resonator;
launching the light from the one or more laser sources as a second optical beam into the fiber optic gyroscope, wherein the second optical beam propagates in a direction opposite to the first optical beam;
locking the average frequency of the first optical beam and the second optical beam to a resonance frequency through modulating the first optical beam with a first resonant tracking frequency and modulating the second optical beam with a second resonant tracking frequency;
frequency modulating the second optical beam by a modulation frequency, wherein the modulation frequency is less than the second resonant tracking frequency; and
attenuating signals that result from interference of the first optical beam with the second optical beam.

11. The method of claim 10, further comprising frequency modulating the first optical beam by a second modulation frequency, wherein the first optical beam is frequency modulated 180 degrees out of phase with the frequency modulated second optical beam by the second modulation frequency.

12. The method of claim 10, wherein frequency modulating the second optical beam comprises frequency modulating the second optical beam with a square wave.

13. The method of claim 12, further comprising gating output from the fiber optic resonator during a square wave transition between different frequencies for the modulation frequency and immediately following the square wave transition.

14. The method of claim 13, further comprising replacing the gated output from the resonator with previously acquired average measurements.

15. The method of claim 13, wherein the difference between the frequency of the first optical beam and the second optical beam is greater than 100 Hz except during the square wave transition.

16. The method of claim 10, wherein the second optical beam is frequency modulated by a sinusoid waveform.

17. The method of claim 10, wherein frequency modulation about the resonant frequency is changed when the fiber optic resonator experiences rotation.

18. The method of claim 17, wherein the magnitude of the frequency modulation is increased when the fiber optic resonator experiences rotation.

19. A resonating fiber optic gyroscope system, the system comprising:
a fiber optic resonator;
one or more laser sources, wherein light from the one or more laser sources launches a first optical beam into the fiber optic resonator and a second optical beam into the fiber optic resonator in a direction opposite to the first optical beam;
a first photodetector, wherein the first optical beam is incident upon the first photodetector, the first photodetector providing a first signal;
a second photodetector, wherein the second optical beam is incident upon the second photodetector, the second photodetector providing a second signal;
a first servo loop configured to lock the first optical beam to a resonant frequency of the fiber optic resonator based on the first signal, wherein the first servo loop comprises a modulator that modulates the first optical beam, at at least one of the one or more laser sources, at a first resonant tracking frequency;
a second servo loop configured to lock the second optical beam to a resonance frequency of the fiber optic resonator based on the second signal, wherein the second servo loop comprises a modulator that modulates the second optical beam, at at least one of the one or more laser sources, at a second resonant tracking frequency, wherein the second optical beam is further modulated, at at least one of the one or more laser sources, by a modulation frequency, wherein the modulation frequency is less than the second resonant tracking frequency; and
a filter configured to attenuate signals that result from interference of the first optical beam with the modulated second optical beam.

* * * * *